United States Patent [19]
Kim

[11] Patent Number: 5,859,467
[45] Date of Patent: Jan. 12, 1999

[54] INTEGRATED CIRCUIT MEMORY DEVICES HAVING IMPROVED SUPPLY LINE CONNECTIONS, AND METHODS OF FORMING SAME

[75] Inventor: Han-Soo Kim, Kyungki-do, Rep. of Korea

[73] Assignee: Samsung Electronics Co., Ltd., Suwon, Rep. of Korea

[21] Appl. No.: 883,878

[22] Filed: Jun. 27, 1997

[30] Foreign Application Priority Data

Sep. 25, 1996 [KR] Rep. of Korea .................. 1996 42641

[51] Int. Cl.$^6$ ...................................................... H01L 27/11
[52] U.S. Cl. ........................... 257/536; 257/538; 257/904
[58] Field of Search .................................... 257/903, 904, 257/393, 536; 438/210

[56] References Cited

U.S. PATENT DOCUMENTS

| | | | |
|---|---|---|---|
| 5,323,045 | 6/1994 | Murai ........................................ | 257/904 |
| 5,446,689 | 8/1995 | Yasui et al. .............................. | 257/904 |
| 5,661,325 | 8/1997 | Hayashi et al. .......................... | 257/904 |

Primary Examiner—David B. Hardy
Attorney, Agent, or Firm—Myers Bigel Sibley & Sajovec

[57] ABSTRACT

Integrated circuit memory devices having improved supply line connections utilize preexisting semiconductor regions (e.g., N-type well regions) in a semiconductor substrate as interconnect regions between thin polysilicon supply lines and metal supply lines. A semiconductor substrate is provided having a region of first conductivity type semiconductor therein extending to a face thereof. This region of first conductivity type may be formed in a peripheral circuit portion of the substrate. A memory device, such as an SRAM device, is also preferably provided adjacent the face of the substrate, in a memory cell portion of the substrate. The memory device contains at least one polysilicon load element therein having a first resistivity. A polysilicon supply line is also electrically connected in series between the polysilicon load element and the region of first conductivity type. The polysilicon supply line is preferably formed as an extension of the polysilicon load element but is doped more heavily with an impurity of predetermined conductivity type so that it has a second resistivity which is less than the first resistivity. In addition, a metal supply line is electrically connected to the region of first conductivity type so that an indirect electrical connection is made between the polysilicon supply line and the metal supply line. Accordingly, a preexisting semiconductor region in the substrate may be utilized as an interconnect region to reliably electrically interconnect supply lines having reduced thicknesses.

9 Claims, 7 Drawing Sheets

5,859,467

INTEGRATED CIRCUIT MEMORY DEVICES HAVING IMPROVED SUPPLY LINE CONNECTIONS, AND METHODS OF FORMING SAME

FIELD OF THE INVENTION

The present invention relates to semiconductor integrated circuits and methods of forming same, and more particularly to integrated circuit memory devices and methods of forming same.

BACKGROUND OF THE INVENTION

A unit cell of an SRAM device typically consists of two inverters interconnected to operate as a flip-flop. Such unit cells are typically classified as high resistance load type NMOS (N-channel Metal Oxide Semiconductor) memory cells or Complementary Metal Oxide Semiconductor (CMOS) type memory cells. As will be understood by those skilled in the art, NMOS type SRAM devices typically employ a high resistance polysilicon line as a high resistance load element.

FIG. 1 illustrates a unit cell of an SRAM device according to the prior art. Typical SRAM devices are also disclosed in U.S. Pat. No. 4,916,668, entitled "Internal Synchronization Type MOS SRAM with Address Transition Detecting Circuit" and in an article entitled "65A 17ns 64K CMOS RAM with a Schmitt Trigger Sense Amplifier", International Solid-State Circuits Conference Digest of Technical Papers, p. 64, (1985). Referring now to FIG. 1, a conventional four transistor SRAM unit cell comprises a pair of high resistance polysilicon load elements 106 and 107, a pair of cross-coupled NMOS drive transistors 104 and 105, and a pair of NMOS transfer transistors 102 and 103.

The high resistance polysilicon load elements 106 and 107 have first ends connected to a supply line 100 (which is typically coupled to a supply (e.g., VCC) in a peripheral circuit region of an integrated circuit substrate) and second ends connected to the drains of respective NMOS drive transistors 104 and 105 at a pair of nodes N1 and N2. The sources of the drive transistors 104 and 105 are connected to a ground voltage line 101. As will be understood by those skilled in the art, the nodes N1 and N2 store complementary data. This complementary data can be accessed by turning on the NMOS transfer transistors 102 and 103 so that the data on node N1 can be transferred to a bit line B/L and the complementary data on node N2 can be transferred to a complementary bit line $\overline{B/L}$.

FIG. 2 illustrates schematically a layout of a memory cell array region 200 and a peripheral circuit region 300 of a semiconductor memory device according to conventional technology. FIG. 3 is a cross sectional view of the layout schematic of FIG. 2, taken along line 3–3'. Referring now to FIGS. 1–3, the supply line 100 is extended from the memory cell array region 200 to the peripheral circuit region 300 and is connected with first ends of the high resistance polysilicon load elements 106 and 107. As illustrated, a metal supply line 108 in the peripheral circuit region 300 is electrically connected to the supply line 100 by means of a contact via 109. This contact via 109 extends partially through a first electrically insulating layer 111 which extends opposite a substrate 400.

Here, the supply line 100 is formed from the same layer of polysilicon as the high resistance polysilicon load elements 106 and 107, but is formed to have a substantially higher electrical conductivity in order to keep the standby current of the memory cell low, increase the stability of the memory cell, and maintain the current supplied to the memory cell through the supply line 100 stable to enhance the memory cell's data storage capacity. In particular, the supply line 100 is preferably doped with an impurity of first conductivity type (e.g. N-type) at a high level while the load elements 106 and 107 are doped with the same impurity but at a much lower level, or with an impurity of second conductivity type (to compensate for the dopant of first conductivity type). Thus, the resistance of the load elements 106 and 107 can be set to a higher level than the resistance of the supply line 100. However, the ability to form load elements 106 and 107 having sufficiently high resistances can be limited as the degree of integration increases because the length of the wiring interconnects and the length of the load elements 106 and 107 decreases.

To address this problem, the thicknesses of the polysilicon load elements 106 and 107 are reduced to maintain the resistances at sufficiently high levels. Similarly, the thickness of the supply line 100 is also typically reduced since it is typically formed by patterning the same layer of polysilicon used to form the load elements 106 and 107. However, as will be understood by those skilled in the art, the use of supply lines 100 which are too thin can lead to reduced reliability and reduced yield in the event such thin lines are accidently overetched during subsequent process steps to form contact vias. For example, as best illustrated by FIG. 4, the polysilicon supply line 100 may be accidently overetched during the step of forming a contact via 109, thereby exposing a lower conductive layer 112. When this occurs, subsequent metal lines including the metal supply line 108 may be formed with poor electrical contact to the polysilicon supply line 100 and with accidental contact (i.e., "short circuit") to a lower conductive layer 112. This reduces device reliability.

One attempt to reduce the likelihood of overetching of thin supply lines is illustrated by FIGS. 5–6. FIG. 5 is an alternative layout schematic view of an electrical interconnect between a polysilicon supply line 100 and a metal supply line 108 and FIG. 6 is a cross-sectional view of the electrical interconnect of FIG. 5, taken along line 6–6'. A conductive layer 121 is used as an intermediate electrical interconnect between a polysilicon supply line 100 which extends from a memory circuit region 200 and a metal supply line 108 which extends from a peripheral circuit region 300. As illustrated, a first contact hole 113 is formed in a first electrically insulating layer 111 prior to formation of the polysilicon supply line 100 and then a second contact hole 109 is formed through a second electrically insulating layer 114 prior to formation of the metal supply line 108. Accordingly, the metal supply line 108 is indirectly electrically connected to the polysilicon supply line 100 by the conductive layer 121. Thus, it is unnecessary to perform an etching step to expose and possibly overetch the polysilicon supply line 100. But, it is necessary to employ an additional conductive layer 121 which means the fabrication steps needed to form the memory device interconnects of FIGS. 5–6 is complicated.

Thus, notwithstanding the above attempts to form integrated circuit memory devices, there continues to be a need for methods of forming integrated circuit memory devices having improved supply line connections.

SUMMARY OF THE INVENTION

It is therefore an object of the present invention to provide improved integrated circuit memory devices, and methods of forming same.

It is another object of the present invention to provide integrated circuit memory devices having improved supply line connections, and methods of forming same.

These and other objects, advantages and features of the present invention are provided by integrated circuit memory devices (e.g., SRAM devices) which utilize preexisting semiconductor regions (e.g., N-type well regions) in a semiconductor substrate as interconnect regions between thin polysilicon supply lines and metal supply lines. According to a first embodiment of the present invention, a semiconductor substrate is provided having a region of first conductivity type semiconductor therein extending to a face thereof. This region of first conductivity type may be formed in a peripheral circuit region of the substrate. A memory device, such as an SRAM device, is also preferably provided adjacent the face of the substrate, in a memory cell region of the substrate. The memory device contains at least one polysilicon load element therein having a first resistivity. A polysilicon supply line is also electrically connected in series between the polysilicon load element and the region of first conductivity type. The polysilicon supply line is preferably formed as an extension of the polysilicon load element but is doped more heavily with an impurity of predetermined conductivity type so that it has a second resistivity which is less than the first resistivity. In addition, a metal supply line is electrically connected to the region of first conductivity type so that an indirect electrical connection is made between the polysilicon supply line and the metal supply line. Accordingly, a preexisting semiconductor region in the substrate may be utilized as an interconnect region to reliably electrically interconnect supply lines having reduced thicknesses.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
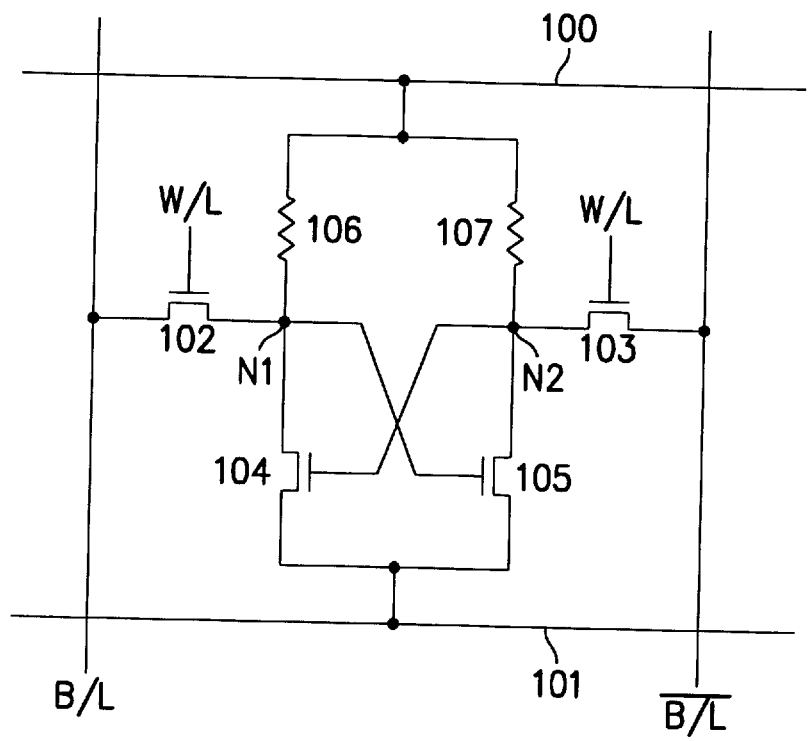
FIG. 1 is an electrical schematic of an static random access memory (SRAM) device according to the prior art.
Figure 2:
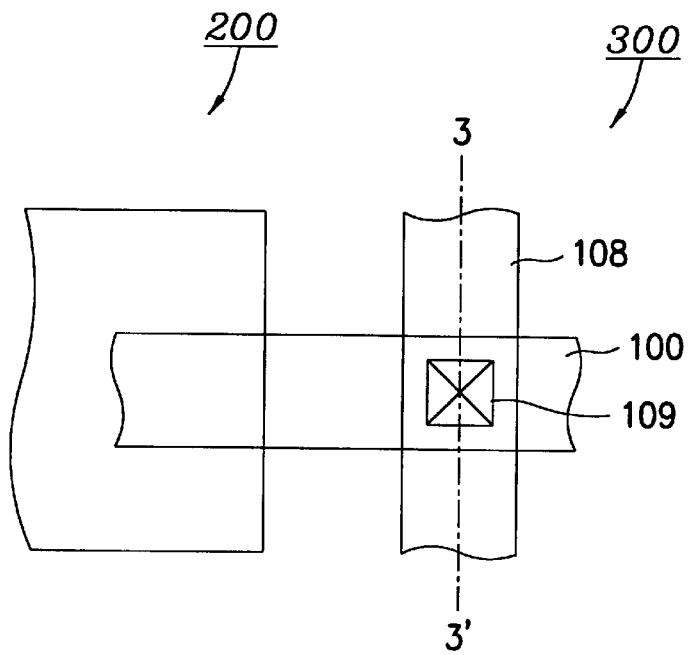
FIG. 2 is a layout schematic view of an electrical interconnect between a polysilicon supply line and a metal supply line, according to the prior art.
Figure 3:
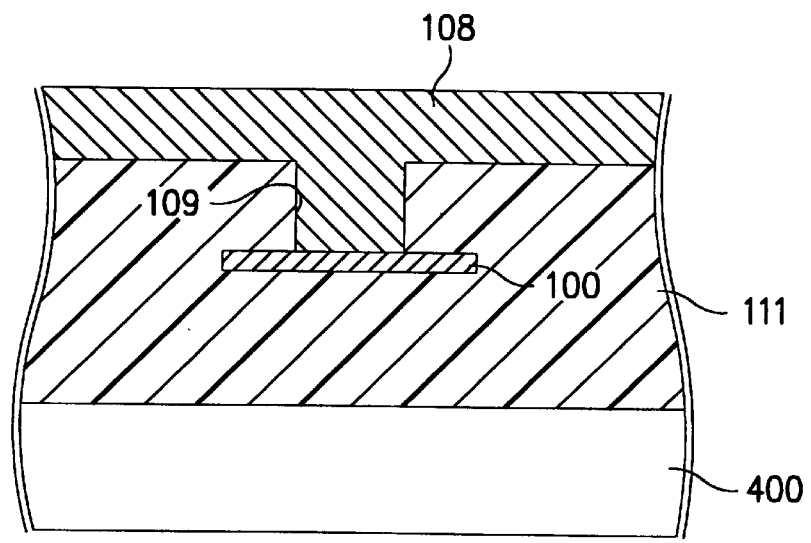
FIG. 3 is a cross-sectional view of the electrical interconnect of FIG. 2, taken along line 3–3'.
Figure 4:
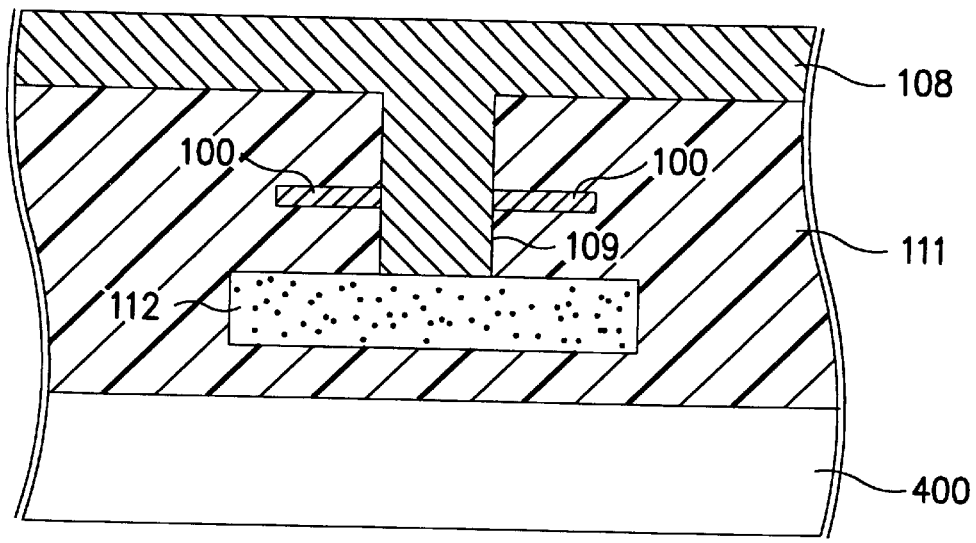
FIG. 4 is a cross-sectional view of an electrical interconnect according to the prior art.
Figure 5:
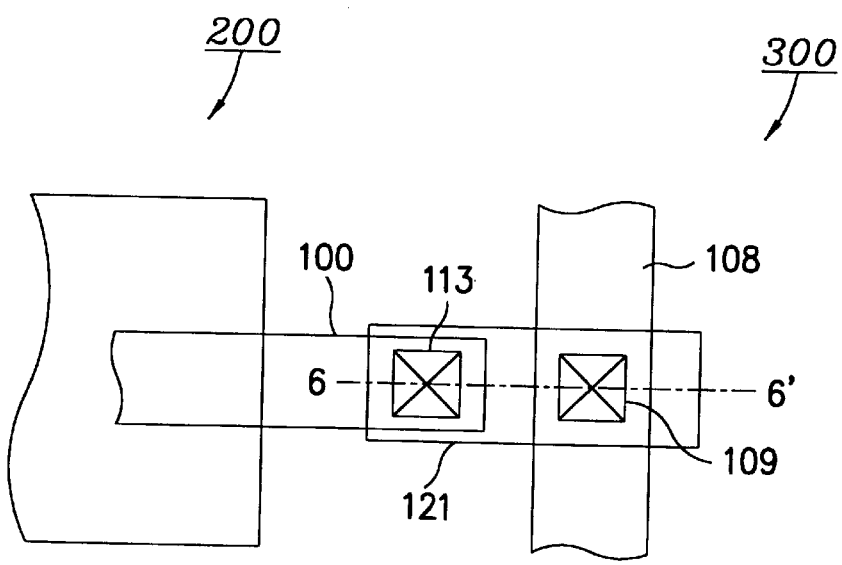
FIG. 5 is a layout schematic view of an electrical interconnect between a polysilicon supply line and a metal supply line, according to the prior art.
Figure 6:
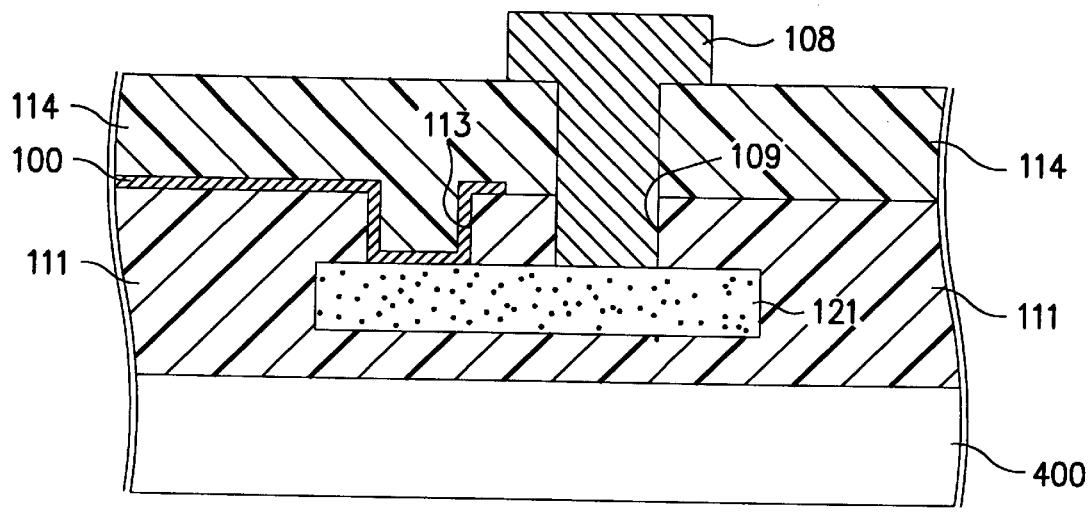
FIG. 6 is a cross-sectional view of the electrical interconnect of FIG. 5, taken along line 6–6'.
Figure 7:
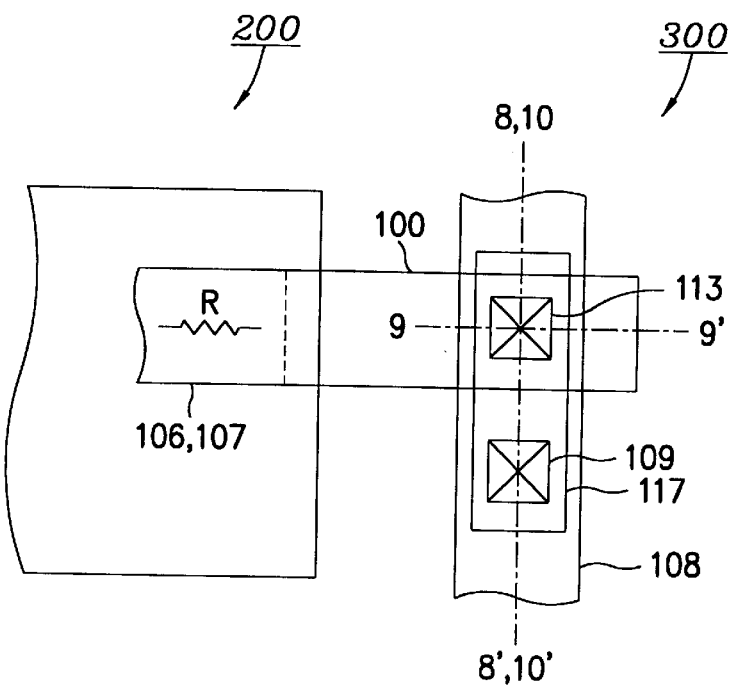
FIG. 7 is a layout schematic view of an electrical interconnect between a polysilicon supply line and a metal supply line, according to an embodiment of the present invention.
Figure 8:
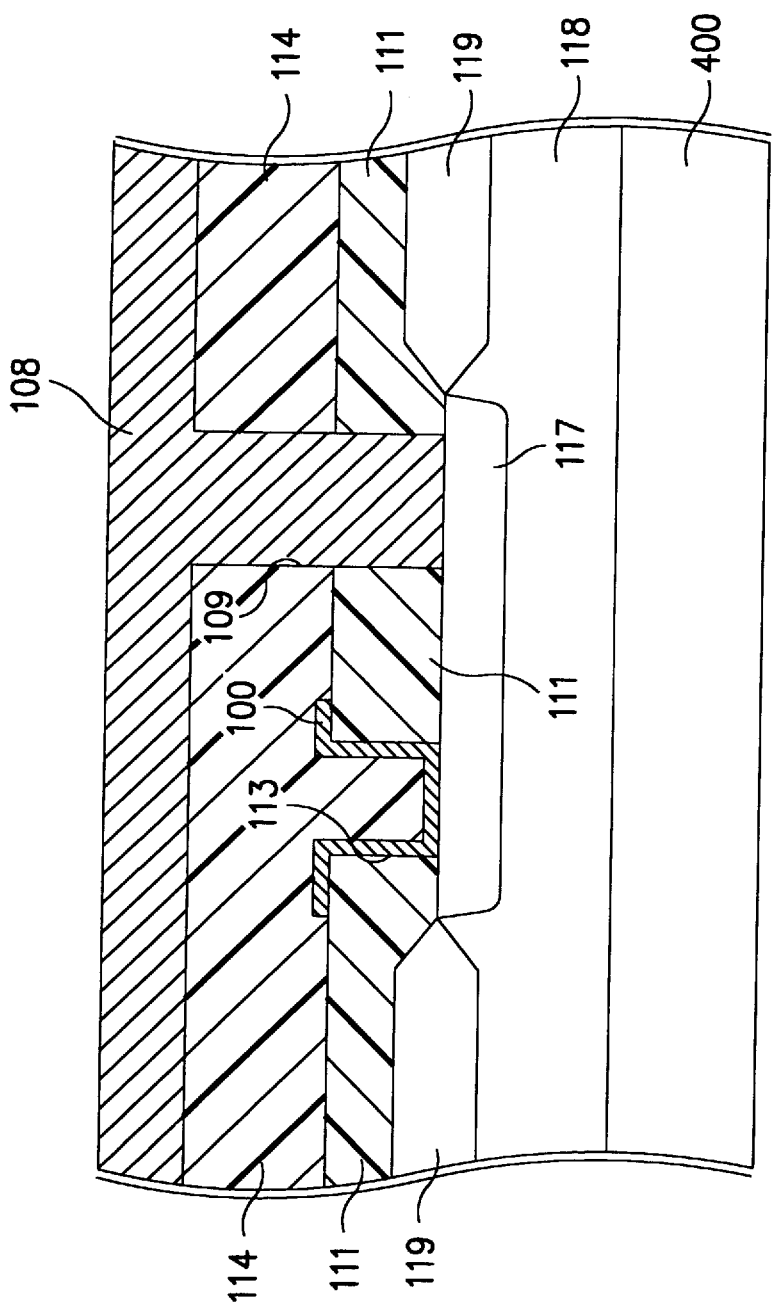
FIG. 8 is a cross-sectional view of the electrical interconnect of FIG. 7, taken along line 8–8'.
Figure 9:
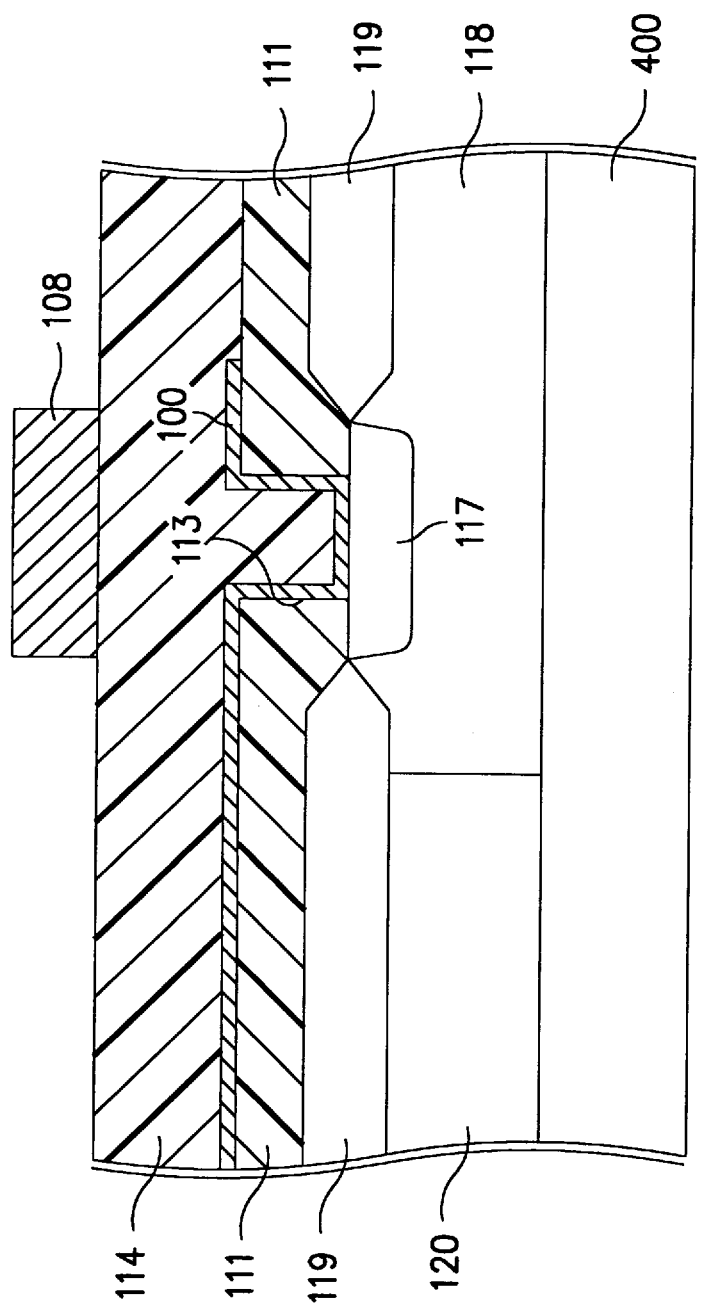
FIG. 9 is a cross-sectional view of the electrical interconnect of FIG. 7, taken along line 9–9'.
Figure 10:
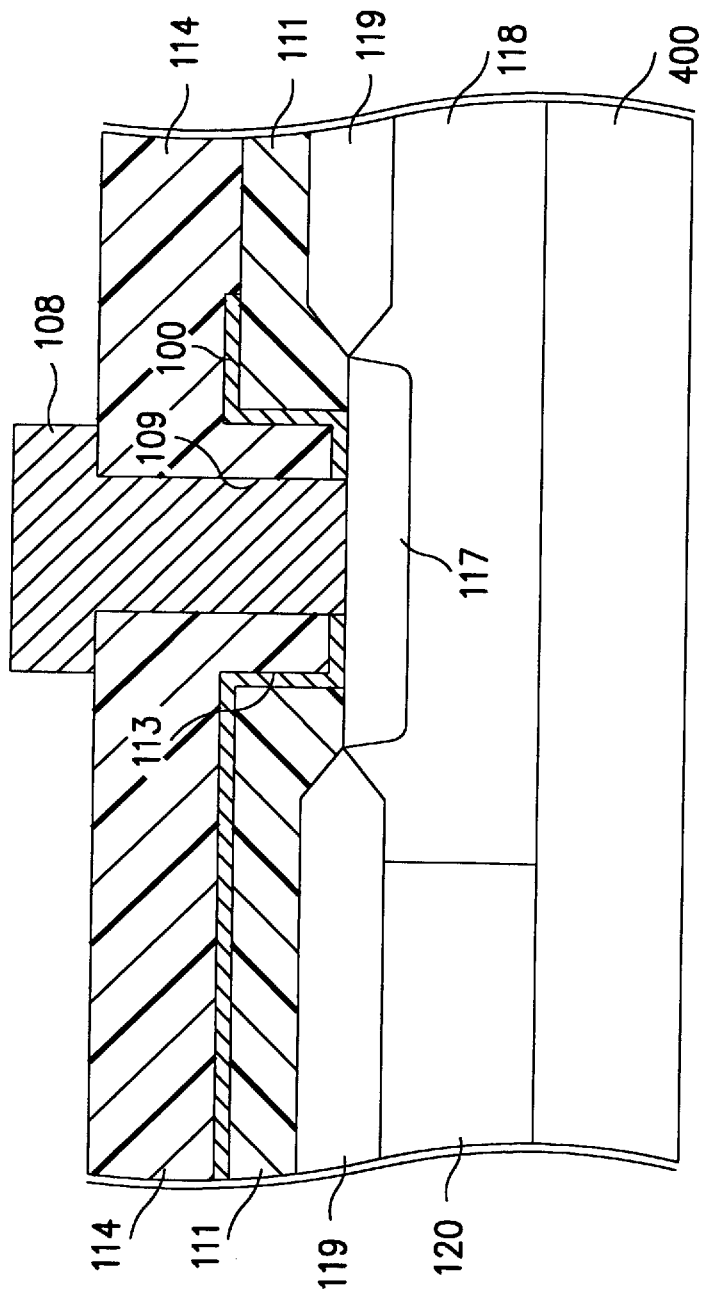
FIG. 10 is an alternative cross-sectional view of the electrical interconnect of FIG. 7, taken along line 10–10'.

Referring now to FIGS. 7–10, integrated circuit memory devices having improved supply line connections according to the present invention will be described. Here, FIG. 7 illustrates a layout schematic view of an electrical interconnect between a polysilicon supply line 100 and a metal supply line 108, according to an embodiment of the present invention and FIG. 8 is a cross-sectional view of the electrical interconnect of FIG. 7, taken along line 8–8'. FIG. 9 is also a cross-sectional view of the electrical interconnect of FIG. 7, taken along line 9–9', and FIG. 10 is an alternative cross-sectional view of the electrical interconnect of FIG. 7, taken along line 10–10'. In particular, FIG. 7 illustrates a thin polysilicon supply line 100 having a thickness of less than about 1000 Å extending from a memory cell array region 200 in an integrated circuit memory device to a peripheral circuit region 300. As described more fully hereinbelow with respect to FIGS. 8–10, an activation region 117 of first conductivity type semiconductor is formed in a substrate 400 to provide an intermediate electrical interconnect path between the polysilicon supply line 100 and the metal (e.g., aluminum) supply line 108. First and second contact holes or vias 113 and 109, respectively, are also provided in electrically insulating layers. The polysilicon supply line 100 and metal supply line 108 are also patterned in the contact holes in ohmic contact with the activation region 117.

Referring now specifically to FIGS. 8–9, a semiconductor substrate 400 of second conductivity type (e.g., P-type) is provided having a first well region 118 of first conductivity type (e.g., N-type) therein extending to a face thereof. The first well region 118 may be formed adjacent a second well region 120 of second conductivity type using conventional techniques well known to those skilled in the art. A relatively highly doped activation region 117 of first conductivity type is also preferably formed in the substrate 400 by forming field oxide isolation regions 119 using conventional techniques such as local oxidation of silicon (LOCOS) and then implanting first conductivity type dopants into the first well region 118 using the field oxide isolation regions 119 as an implant mask. A first electrically insulating layer 111 (e.g., $SiO_2$) is then formed on the field oxide isolation regions 119 and activation region 117 using conventional techniques. A first contact hole 113 is then formed in the first electrically insulating layer 111 by photolithographically patterning a layer of photoresist (not shown) on the first electrically insulating layer 111 and then etching the first electrically insulating layer 111 using the layer of photoresist as an etching mask. A blanket layer of polycrystalline silicon (polysilicon) is then deposited on the first electrically insulating layer 111 and in the first contact hole 113 and then patterned to define at least one load element (106, 107) and a polysilicon voltage supply line 100 which is contiguous with the at least one load element. A step may also be performed to increase the conductivity of the polysilicon voltage supply line 100 relative to the load element. For example, the patterned layer of polysilicon may be selectively doped with impurities of predetermined conductivity type (e.g., N-type) so that the portion of the patterned layer corresponding to the polysilicon voltage supply line 100 has a low resistance. Alternatively, the entire patterned layer of polysilicon may be doped with an impurity of predetermined conductivity type and then the portion of the patterned layer corresponding to the load elements 106, 107 may be doped with an impurity of opposite conductivity type (e.g, P-type) to provide compensation and increase the resistivity of the load element portions. The resistance of the load element portions may also be increased by depositing the layer of polysilicon at a thickness of less than about 1000Å.

Next, a blanket second electrically insulating layer 114 (e.g., $SiO_2$) is formed on the polysilicon supply line 100 and the first electrically insulating layer 111. Conventional techniques are then used to form a second contact hole 109 which extends through the first and second electrically insulating layers 111 and 114 and exposes the highly conductive activation region 117. The activation region 117 may be formed simultaneously with steps to form adjacent active regions (not shown) of adjacent devices in the memory and peripheral circuit regions of the substrate. A blanket layer of metallization (e.g., aluminum) is then deposited on the second electrically insulating layer 114 and patterned to form a metal supply line 108 which ohmically contacts the activation region 117 through the second contact hole 109. Accordingly, the activation region 117 acts as an intermediate interconnect region so that a reliable electrical connection can be made indirectly between the metal supply line 108 and the thin polysilicon supply line 100 which may have a thickness less than 1000Å.

Referring now to FIG. 10, an alternative embodiment of the present invention is illustrated. In particular, the first contact hole 113 and second contact hole 109 are formed in an overlapping manner. Thus, the second contact hole 109 can be formed by etching through the second electrically insulating layer 114 and then polysilicon supply line 100 to expose the activation region 117 which provides a reliable interconnect.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   a semiconductor substrate having a region of first conductivity type semiconductor therein extending to a face thereof;
   a memory cell array region of a memory device adjacent the face, said memory cell array region containing at least one polysilicon load element therein having a first resistivity and a thickness less than about 1000Å;
   a polysilicon voltage supply line electrically connected in series between the polysilicon load element and the region of first conductivity type, said polysilicon voltage supply line having a second resistivity less than the first resistivity and a thickness less than about 1000Å; and
   a metal voltage supply line electrically connected to the region of first conductivity type; and
   wherein the face defines first and second interfaces between said polysilicon voltage supply line and said metal voltage supply line, respectively.

2. The memory device of claim 1, further comprising a first electrically insulating layer on the face, said first electrically insulating layer having first and second contact holes therein extending opposite the region of first conductivity type; wherein said polysilicon voltage supply line is disposed in the first contact hole in ohmic contact with the region of first conductivity type; and wherein said metal voltage supply line is disposed in the second contact hole in ohmic contact with the region of first conductivity type.

3. The memory device of claim 1, further comprising a first electrically insulating layer on the face, said first electrically insulating layer having a first contact hole therein; and wherein said polysilicon voltage supply line is disposed in the first contact hole in ohmic contact with the region of first conductivity type.

4. The memory device of claim 3, further comprising:
   a second electrically insulating layer on said polysilicon voltage supply line, opposite the region of first conductivity type;
   a second contact hole extending through said second electrically insulating layer and said polysilicon voltage supply line; and
   wherein said metal voltage supply line extends through said second contact hole and ohmically contacts the region of first conductivity type at the face.

5. The memory device of claim 4, wherein said memory cell array region comprises a memory cell array region of a static random access memory device.

6. A method of forming an integrated circuit memory device, comprising the steps of:
   forming a semiconductor substrate having a region of first conductivity type therein extending to a face thereof;
   forming a memory cell array region of a memory device containing at least one polysilicon load element therein having a first resistivity and a thickness less than about 1000 Å, adjacent the face;
   forming a polysilicon voltage supply line electrically connected in series between the polysilicon load element and the region of first conductivity type, the polysilicon voltage supply line having a second resistivity less than the first resistivity and a thickness less than about 1000 Å; and
   forming a metal voltage supply line electrically connected to the region of first conductivity type, and
   wherein the face defines first and second interfaces between the polysilicon voltage supply line and the metal voltage supply line, respectively.

7. The method of claim 6, further comprising the steps of:
   forming a first electrically insulating layer on the substrate;
   forming first and second contact holes in the first electrically insulating layer to expose the region of first conductivity type at respective first and second locations on the face;
   wherein said step of forming a polysilicon voltage supply line comprises forming a polysilicon voltage supply line in the first contact hole, in ohmic contact with the region of first conductivity type; and
   wherein said step of forming a metal voltage supply line comprises forming a metal voltage supply line in the second contact hole, in ohmic contact with the region of first conductivity type.

8. The method of claim 6, further comprising the steps of:
   forming a first electrically insulating layer on the substrate;
   forming a first contact hole in the first electrically insulating layer to expose the region of first conductivity type at the face; and
   wherein said step of forming a polysilicon voltage supply line comprises forming a polysilicon voltage supply line in the first contact hole in ohmic contact with the region of first conductivity type.

9. The method of claim 8, further comprising the steps of:

forming a second electrically insulating layer on the polysilicon voltage supply line, opposite the region of first conductivity type;

forming a second contact hole extending through the second electrically insulating layer and through the polysilicon voltage supply line to expose the region of first conductivity type at the face; and wherein said step of forming a metal voltage supply line comprises forming a metal voltage supply line which extends through the second contact hole and ohmically contacts the region of first conductivity type at the face.

* * * * *